United States Patent [19]
Abry et al.

[11] Patent Number: 5,993,615
[45] Date of Patent: Nov. 30, 1999

[54] METHOD AND APPARATUS FOR DETECTING ARCS

[75] Inventors: Charles R. Abry, Burlington; William J. Murphy, Essex Junction; Jeffrey N. Seward, Underhill Center, all of Vt.

[73] Assignee: International Business Machines Corporation, Armonk, N.Y.

[21] Appl. No.: 08/879,285

[22] Filed: Jun. 19, 1997

[51] Int. Cl.$^6$ ............................................. C23C 14/34
[52] U.S. Cl. ........................ 204/192.13; 204/192.12; 204/298.03; 118/712
[58] Field of Search .................. 204/192.12, 298.03, 204/192.17, 192.13; 118/712

[56] References Cited

U.S. PATENT DOCUMENTS

| | | | |
|---|---|---|---|
| 5,427,669 | 6/1995 | Drummond | 204/298.08 |
| 5,566,060 | 10/1996 | Shimer et al. | 363/65 |
| 5,576,939 | 11/1996 | Drummond | 363/16 |
| 5,611,899 | 3/1997 | Maass | 204/298.08 |
| 5,698,082 | 12/1997 | Teschner et al. | 204/298.03 |
| 5,718,813 | 2/1998 | Drummond et al. | 204/192.12 |
| 5,863,392 | 1/1999 | Drummond et al. | 204/192.12 |

*Primary Examiner*—Yogendra Gupta
*Assistant Examiner*—Christine E. Ingersoll
*Attorney, Agent, or Firm*—Delio & Peterson, LLC; Peter W. Peterson; James M. Leas

[57] ABSTRACT

The present invention is a thin film deposition tool with arc detection capabilities. An arc detector is provided in the power supply line between the power supply and the sputter deposition tool. Arcs are detected by the arc detector and counted using a logic circuit. Arc data is collected and analyzed and real-time data is provided which can be used to stop further processing until a repair is made.

27 Claims, 6 Drawing Sheets

METHOD AND APPARATUS FOR DETECTING ARCS

BACKGROUND OF THE INVENTION

1. Field of the Invention

The present invention relates to arc detection and, in particular, to a method and apparatus for detecting arcs during sputter deposition.

2. Problem to be Solved

Physical Vapor Deposition (PVD), also known as sputtering, is a process for forming thin metal layers on wafers used for integrated circuits (ICs). The technique requires the use of a typical PVD sputter chamber 10 illustrated in FIG. 1 which includes vacuum chamber 11. The technique is generally performed according to the following description. A target 12 formed of a material such as a metal or insulator is placed in a vacuum chamber 11 and connected electrically as a cathode. An anode 13 provides reference to ground. An electric field placed between the target 12 and the anode 13 by a power supply 15 causes a low pressure gas, such as argon, to ionize. Ionized gas atoms are accelerated across the electric potential and impact the target 12 at high speed, causing target metal atoms to be physically removed or sputtered. The metal atoms ejected from the target material travel virtually unimpeded through the low pressure gas and plasma and strike substrate 14 forming a coating having an approximately uniform thickness.

Arcing occurs when a path from ground to the target is established through electrons or ions in the plasma. Arcing during PVD can be caused by factors such as contamination or inclusion within the structure of the target or from such tool maintenance factors as contamination from other sources such as vacuum grease, vacuum leaks, or improper alignment of the target. Contaminants in the target, referred to as inclusions, can include $SiO_2$ or $Al_2O_3$. Arcing during PVD carl cause damage to semiconductor chips on a wafer and reduce the yield of good chips on the wafer. While normal metal deposition is typically less than 1 micron thick, the arcing causes a locally thicker deposition of metal on the wafer. Subsequent processes are used to pattern and etch metal lines onto the wafer. Since the local defect is thicker than the surrounding metal, the defect is not etched through in the subsequent processing, and this can result in a short circuit on the chip. The local defect can also distort a pattern imaged onto the wafer in a subsequent photolithography step. A semiconductor chip has multiple levels of metal lines separated by an insulator, each of the metal levels formed by a process such as: sputter depositing the metal, patterning the metal, and etching the metal. Since a metal short at any level will cause the chip to fail, it is important to avoid damage from arcing during sputter deposition.

Prior art deposition chambers run until the target inclusion which caused the arc is sputtered through or the arc causing problem is fixed. Corrective action is dependent upon the availability of parametric data, for example, the number of metal shorts per layer, or inspection based upon a sample plan which reveals the defects. This information can take weeks to obtain. As a result, both random yield loss and yield loss for an extended time remain undetected.

The effects of arcing have been detected by scanning the surface of wafers after metal deposition with a laser, a costly process. Reliable techniques for finding inclusions in targets that might cause arcing have not been available, and claims by target manufacturers that their targets have low inclusion levels could not previously be substantiated by wafer surface scanning techniques. Furthermore, no process was available to provide real-time monitoring of the arcing in the deposition chamber.

SUMMARY OF THE INVENTION

Bearing in mind the problems and deficiencies of the prior art, it is therefore an object of the present invention to provide a real-time technique for detecting arcing during sputter deposition so that yield loss due to arcing can be prevented.

It is another object of the present invention to provide a process by which a target manufacturer can improve target quality before the targets reach the customer.

A further object of the invention is to provide a method and apparatus which will increase productivity and decrease defects.

It is yet another object of the present invention to provide an apparatus and method of depositing thin layers while decreasing yield loss from defects or damage.

It is still another object of the present invention to reduce cost and cycle time associated with inspecting wafers to monitor a sputter chamber for a random event.

Still other objects and advantages of the invention will in part be obvious and will in part be apparent from the specification.

The above and other objects and advantages, which will be apparent to one of skill in the art, are achieved in the present invention which is directed to, in a first aspect, a plasma processing tool having a control system, comprising: a power supply having a power supply line for connection to a plasma chamber; an arc detector in said power supply line for detecting arcs during processing; and a controller connected to said arc detector to measure an arc-related parameter, said controller further comprising a control line capable of providing a signal based on said parameter.

In another aspect the present invention relates to a thin film processing tool, comprising: an arc detector adapted to detect an arc during a process step; and means to activate an alarm upon detection of an arc.

In another aspect the present invention relates to a method of reducing damage during processing comprising the steps of: (a) providing a power supply for a tool, said power supply having a power supply line; (b) providing an arc detector in said power supply line for detecting arcs in said tool; and (c) providing a controller connected to said arc detector to count said arcs, said controller further comprising a control line capable of providing a signal based on said count.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT (S)

In describing the preferred embodiment of the present invention, reference will be made herein to FIGS. 1–6 of the drawings in which like numerals refer to like features of the invention.

Figure 2:
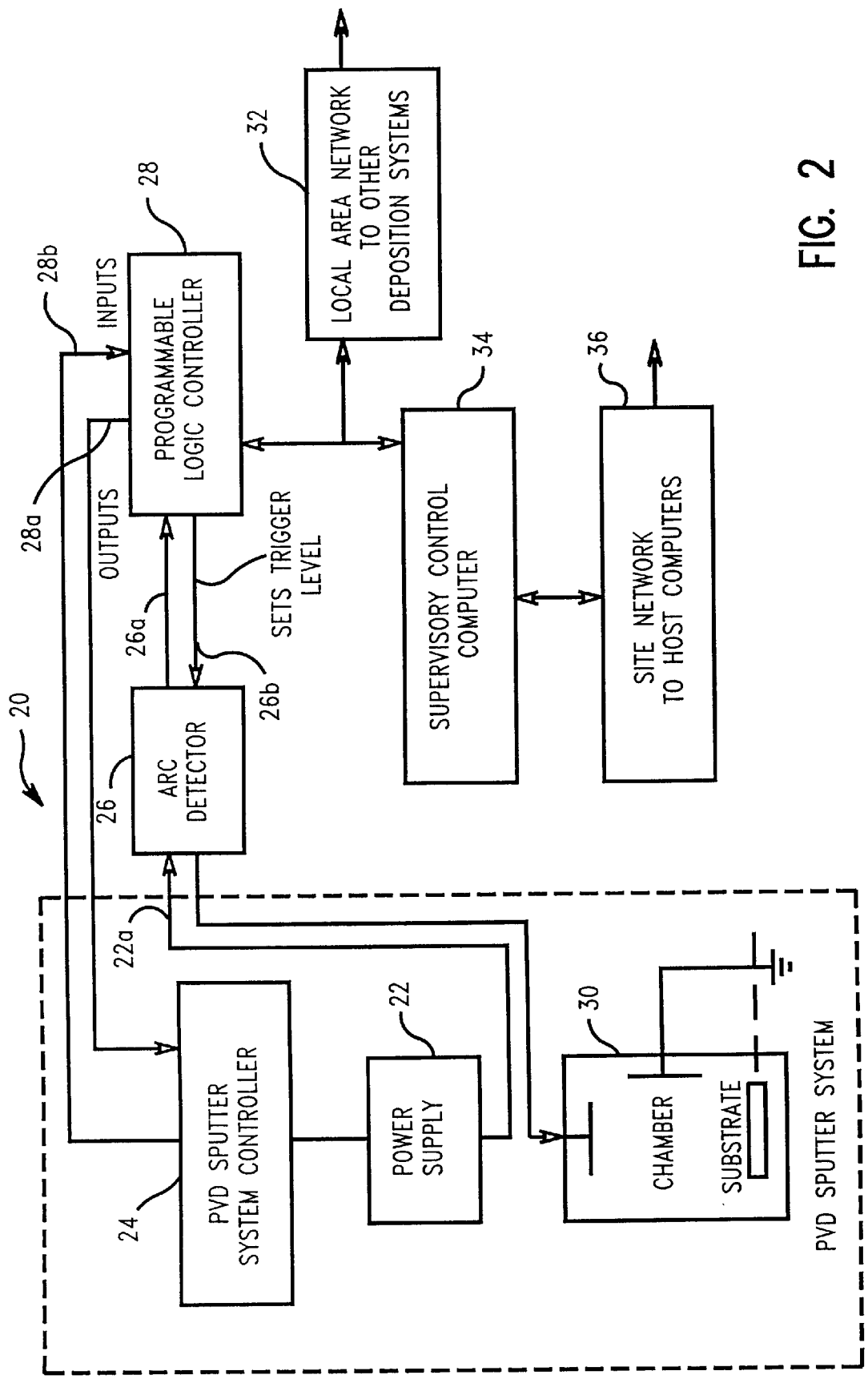
FIG. 2 is a schematic diagram of the arc detection system of the present invention.

The apparatus of the present invention, illustrated in FIG. 2, is a PVD sputter system 20 comprising a power supply 22 controlled by a PVD system controller 24 and connected to an arc detector 26 through power supply line 22a for detecting arcs during a deposition. A Programmable Logic Controller (PLC) 28 is connected to the arc detector 26 through line 26a to count the arcs and through line 26b to set the trigger level of arc detector 26. The PLC 28 further comprises an output line 28a capable of providing a control signal based on the arc count to PVD system controller 24. The PLC also comprises an input line 28b capable of receiving a status signal from the PVD system controller 24.

The sputter system 20 also includes a deposition chamber 30 connected to power supply 22 through arc detector 26, a connection to a LAN 32, and a supervisory control computer 34 that provides data trending and site network support to additional host computers 36. The preferred embodiment uses a PVD sputter system; however, any system which generates a plasma, such as plasma etching or Plasma Enhanced Chemical Vapor Deposition device (PECVD) may be used in place of a PVD Sputter System.

In the preferred embodiment, the arc detector 26 detects arcs electrically. However, arcs may also be detected optically. An arc causes a change in the photo emission of the plasma in the deposition chamber 30. That change can be detected with an optical probe (not shown) inserted into the plasma or by observing light changes through a window (not shown). The optical probe is capable of sending a signal to the PLC, based on optical detection of a change in the photo emission of the plasma caused by arcing to the PLC. Electrical arc detection is preferred over optical arc detection since the field of view in optical detection is limited by the probe design and because the window will become coated with the sputtered material making observation difficult.

Figure 3:
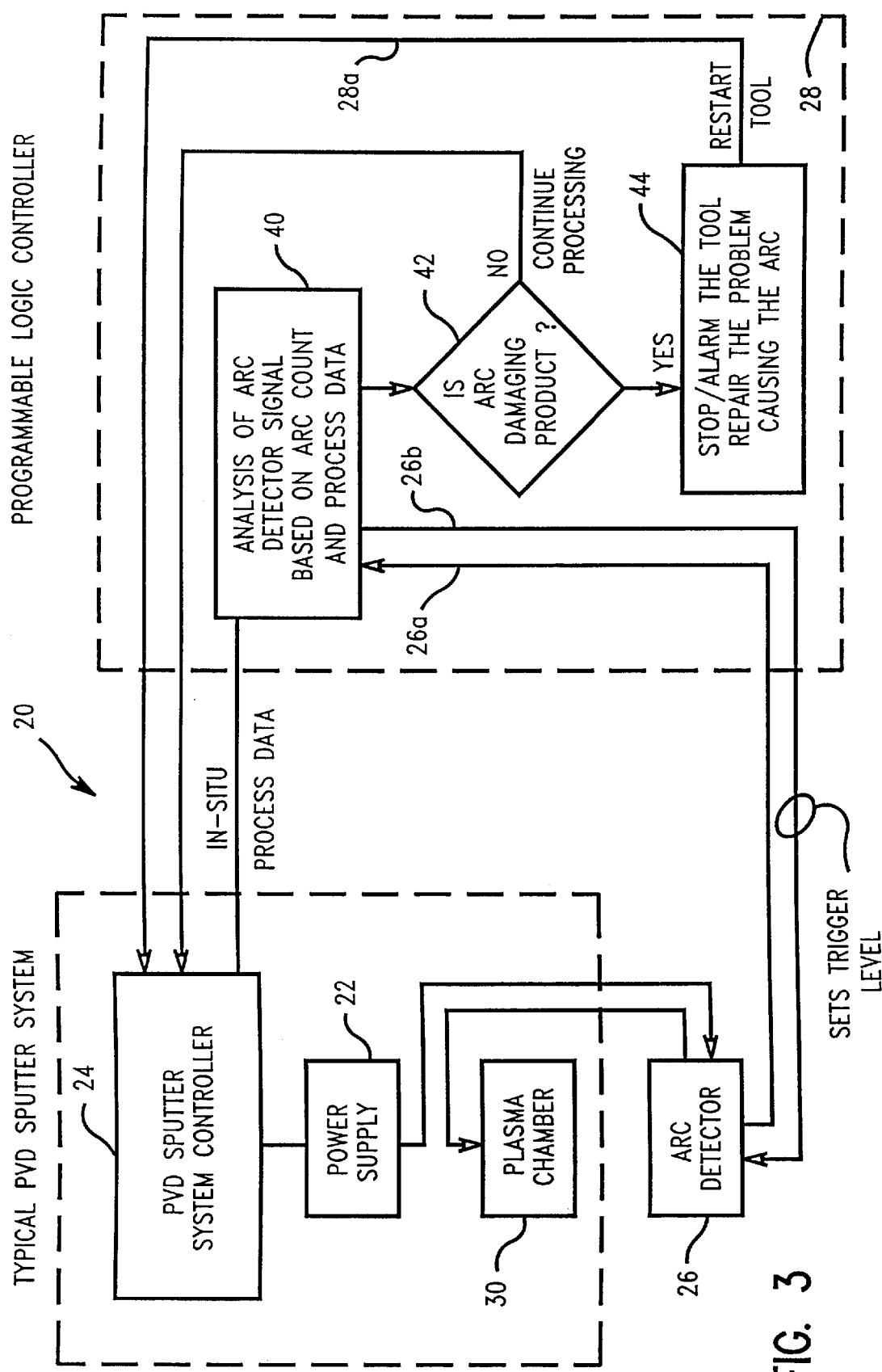
FIG. 3 is a block/logic diagram of the arc detection system of the present invention.
Figure 4:
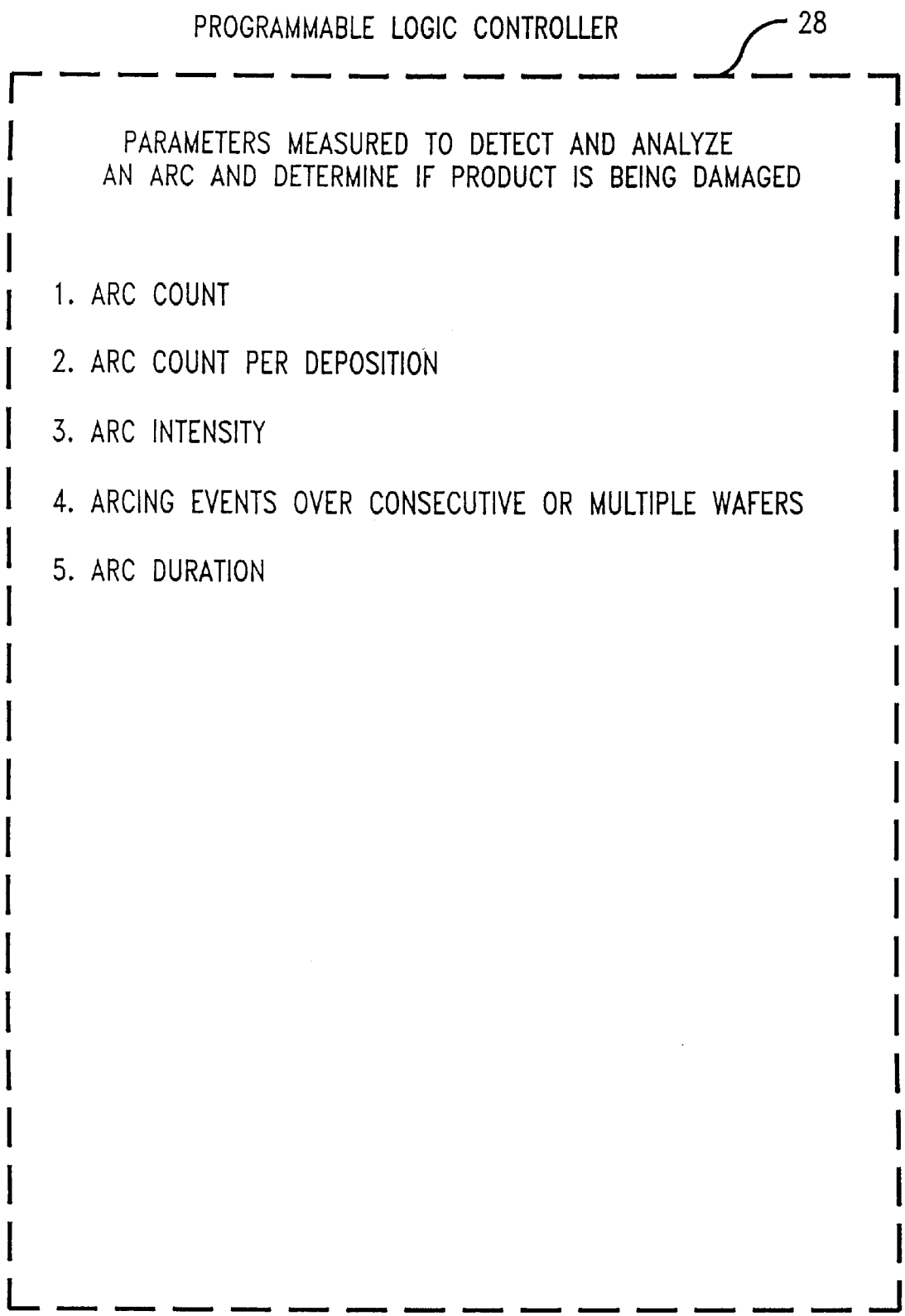
FIG. 4 is a logic diagram for the Programmable Logic Controller (PLC) detailing the logic functions of the PLC.

FIG. 3 includes logic in PLC 28. The arc detector 26 of the PVD sputter system 20 senses change in the target voltage. When the target voltage becomes less than a preset: reference voltage, i.e., is closer to ground potential, the arc detector sends a 0–5 volt square wave pulse (TTL) along line 26a to the PLC 28 indicating the presence of an arc.

In addition to counting arcs for each deposition, PLC 28 is a logic circuit that can perform other real-time analysis of arc information, such as recording the total number of arcs for the target, the arc intensity (referring to the proximity to ground potential indicating a direct short), the continuing arcing indicating a large defect in the target requiring complete tool shut down for repair and arc duration (referring to the time the arc is sustained).

Figure 1:
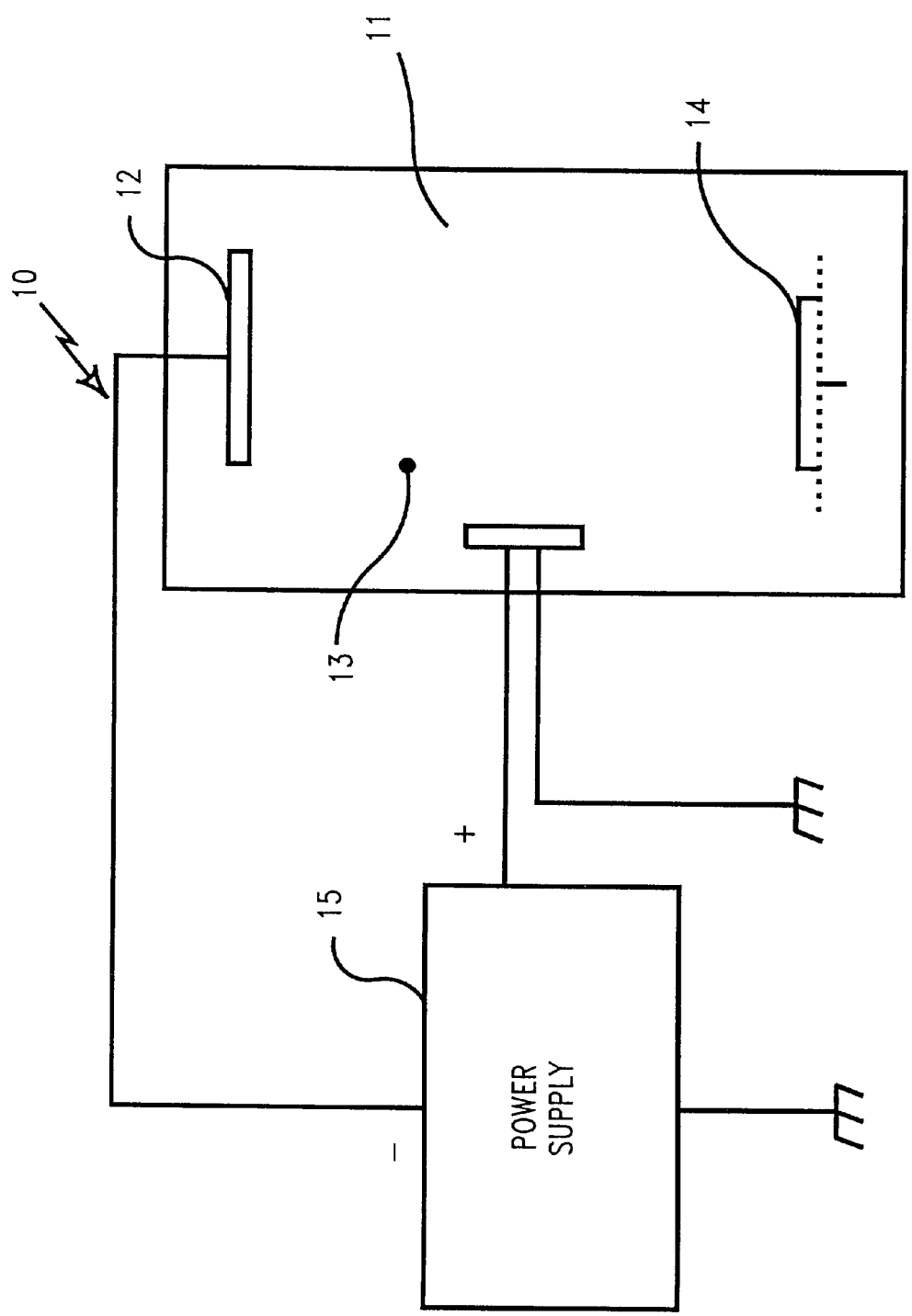
FIG. 1 is a diagram of typical PVD sputter chamber.
Figure 5:
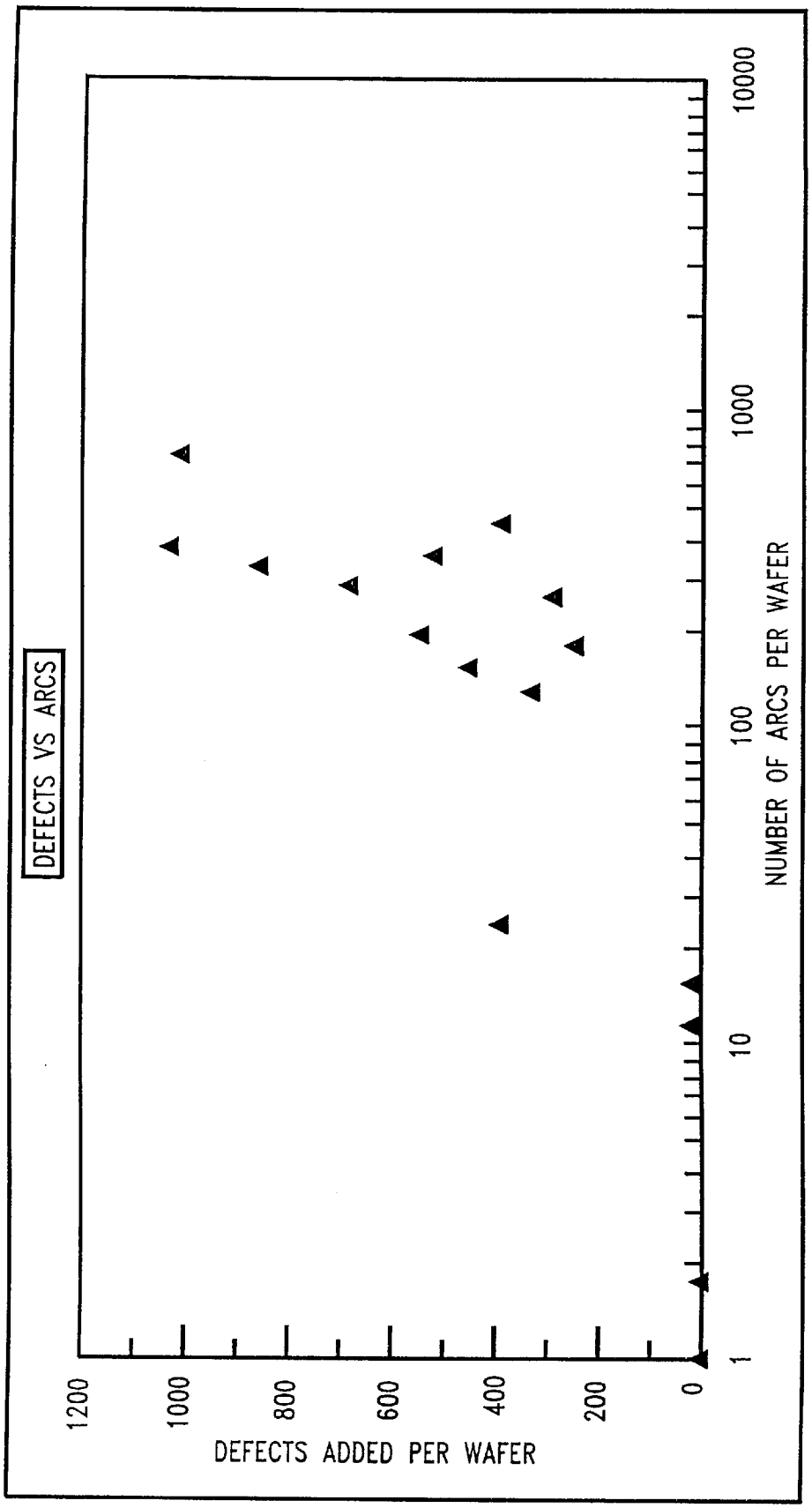
FIG. 5 is a graph correlating the number of arcs per wafer to the number of defects added to that wafer.

Typical target voltage for sputtering aluminum is a steady state value of −450 volts dc (Vdc). The target voltage is negative due to the configuration of the PVD sputter chambers as shown in FIG. 1. Arcing is defined as a shift in the target voltage that crosses a threshold voltage. Two threshold voltages such as −100 Vdc and −200 Vdc can be used to reveal the magnitude of an arc. Thus an arc that crosses the −200V threshold but not the −100V threshold is smaller than an arc that crosses both thresholds. The arc detector sample frequency is 50 kHz which ensures reliable monitoring of the plasma voltage shifts. The counter circuit 40 may be a simple counter register or it can be a personal computer with commercially available data. In the preferred embodiment the counter 40 acquisition software is part of the PLC28. The data collected by the PLC 28 is sent to a recordation device, such as supervisory control computer 34 (FIG. 2) which could be a personal computer (PC) running supervisory software. A program running on the PC logs the data, graphs the data and can provide network based alarms. The PLC 28 provides real-time control of the sputtering chamber 30 through system controller 24 even when the PC is powered down due to failure or other interruptions. When the arc count exceeds a selected number per deposition, the PLC decides according to decision block 42 that the arc is damaging product and the command block 44 sends an alarm on line 28a to the sputter system controller stopping the deposition and indicating that the wafer being processed will have reduced IC yield due to the arcing. For example, when sputtering aluminum targets containing 0.5% copper, the maximum acceptable number of arcs per second or total arcs per deposition was determined to be 20. This number can depend on the material sputtered and may be different for titanium, titanium-nitride or other metals. The maximum acceptable number can be determined by review of data correlating arcs and defects on the wafer as shown in FIG. 5. The apparatus may also provide a signal based on count rate of the arcs detected, or based on rate of change of count rate of the arcs detected. The signal from the control line may also indicate the magnitude of the arc.

FIG. 5 is a graph correlating arcs and defects added on a wafer in one chamber of the PVD system with an Aluminum-0.5% Copper target. The number of arcs per wafer is plotted on the horizontal axis, with a log scale. The vertical axis indicates defects added per wafer. The graph illustrates an exponential increase in defects added when the determined maximum 20 arcs per wafer are exceeded.

Figure 6:
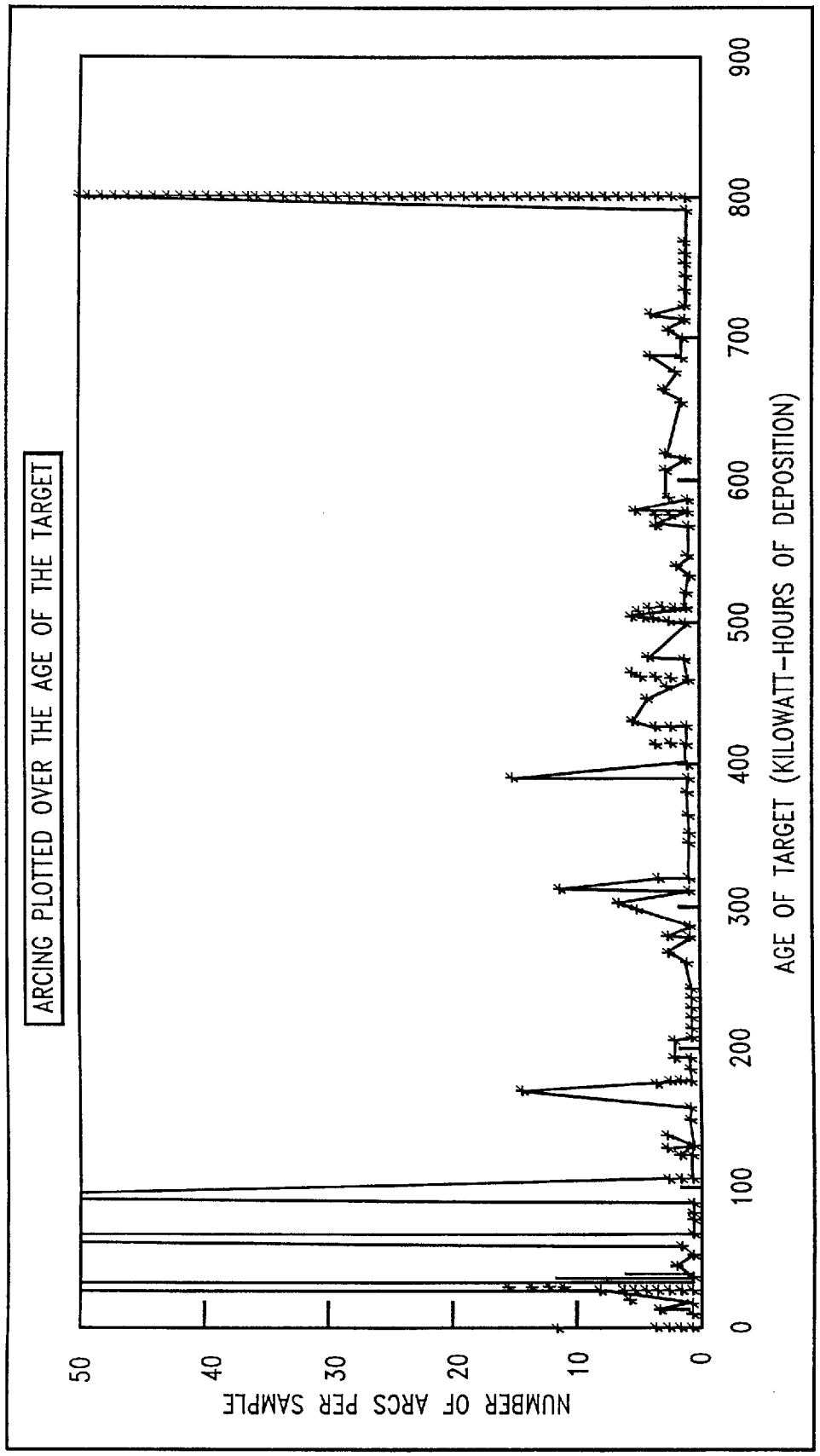
FIG. 6 is a graph having on the horizontal axis the age of the target in kilowatt-hours, and on the vertical axis the number of arcs per second from that target.

FIG. 6 is a plot of number of arcs per sample period over the life of the target. Data from the arc counter is saved once per second, thus the sample period is one second. The sample rate of the arc detector is 50 kHz. Normally, an aluminum target in the PVD sputter chamber lasts 900 kw-hrs. The target graphed in FIG. 6 was removed from the sputter chamber at 800 kw-hrs because of extreme arcing occurring at the 800 kw-hr mark. Analysis of the target surface revealed a large $SiO_2$ defect exposed at the surface. Without real time arc monitoring to indicate the existence of defects, an additional 500 wafers could have been processed with the defective target.

Experiments with the present invention have yielded the following results which verify that the present invention performs as intended: 1) wafers that have been exposed to arcing more than the 20 arcs per deposition then scanned with a laser scanner have orders of magnitude more defects than wafers that have fewer arcs than 20 (see FIG. 5); 2) defects that can produce arcing have been identified in targets after sustained arcing was detected. Lab results verified dielectric inclusions at the surface of the target; 3) low defect targets from two target suppliers that were compared to standard production targets validated the manufacturer's low defect claims; and 4) arcing was found to be associated with vacuum leaks, vacuum grease and misalignment of cathode and anode.

The present invention provides a solution to the above cited problem by providing a control technique which integrates an arc detector with the hardware necessary to inform the user in real-time that there is a problem with the sputtering source and that the wafer just processed can have reduced yield.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A plasma processing apparatus having a control system, comprising:
   a power supply having a power supply line for connection to a powered electrode in a plasma chamber for providing an operating voltage to said powered electrode;
   an arc detector connected to said power supply line for detecting arcs during processing, said arc detector utilizing a first threshold voltage less than said operating voltage and a second threshold voltage less than said first threshold voltage to determine presence and magnitude of an arc relative to said first and second threshold voltages; and
   a controller connected to said arc detector to measure an arc-related parameter, said controller further comprising a control line capable of providing a signal based on said parameter.

2. The apparatus of claim 1, wherein said apparatus is adapted to stop further deposition upon receipt of said signal.

3. The apparatus of claim 1, wherein said apparatus is adapted to activate an alarm upon receipt of said signal.

4. The apparatus of claim 3, wherein said apparatus is adapted to allow further processing upon receipt of said signal while activating said alarm.

5. The apparatus of claim 3, wherein said apparatus is adapted to provide a signal based on count rate of arcs detected.

6. The apparatus of claim 3, wherein said apparatus is adapted to provide a signal based on the rate of change of count rate of arcs detected.

7. The apparatus of claim 3, wherein said apparatus is adapted to stop further processing when count of arcs detected exceeds a selected number per deposition run.

8. The apparatus of claim 7, wherein said apparatus is adapted to stop further processing when the number of arcs detected per deposition run exceeds 20.

9. The apparatus of claim 1 wherein said apparatus is adapted to collect information about arcing in the apparatus.

10. The apparatus of claim 1, wherein said apparatus is a plasma vapor deposition apparatus.

11. The apparatus of claim 1, wherein said apparatus is a sputtering apparatus and said process is deposition.

12. The apparatus of claim 1, wherein said apparatus is adapted to provide a signal from the control line which indicates magnitude of the arc.

13. The apparatus of claim 1, wherein said arc related parameter is a apparatus voltage.

14. The apparatus of claim 13, wherein said apparatus voltage is cathode voltage.

15. A method of detecting arcing during plasma deposition or etch processing comprising the steps of:
   (a) providing a power supply having a power supply line for connection to a powered electrode in a plasma chamber for providing an operating voltage to said powered electrode;
   (b) providing an arc detector in said power supply line for detecting arcs during processing, said arc detector utilizing a first threshold voltage less than said operating voltage and a second threshold voltage less than the first threshold voltage to determine presence and magnitude of an arc relative to said first and second threshold voltages; and
   (c) providing a controller connected to said arc detector to measure an arc related parameter, said controller further comprising a control line capable of providing a signal based on said measurement.

16. The method of claim 15, wherein, in step (c), the signal based on the measurement of said arc related parameter signals detection of an arc relative to said first and second threshold voltages, and further including the steps of:
   (d) detecting an actual target voltage in said power supply line below said operating voltage;
   (e) comparing the actual target voltage to said first and second threshold voltages; and
   (f) signaling detection of an arc relative to said first and second threshold voltages.

17. The method as recited in claim 16, further comprising the step of depositing a layer of material from a target connected to said power supply line while detecting said actual target voltage in said power supply line.

18. The method as recited in claim 17, further comprising the step of determining whether damage had occurred to said target during said depositing step by analyzing said measurement.

19. The method as recited in claim 18, further comprising investigating, detecting, and repairing a defect in said apparatus that caused arcing.

20. The method as recited in claim 16, wherein said depositing step comprises sputter deposition.

21. The method as recited in claim 16, wherein said detecting step further comprises counting arcs.

22. The method as recited in claim 16, wherein said detecting step further comprises determining magnitude of the arc.

23. The method as recited in claim 16, further comprising the step of plasma etching while detecting said actual target voltage in said power supply line.

24. The method as recited in claim 16, wherein said signal is received by a apparatus controller.

25. The method as recited in claim 23, wherein said apparatus controller is adapted to stop operation of said apparatus upon receipt of said signal.

26. The method of claim 21 wherein said signaling step provides a signal based on count rate of arcs detected.

27. The method of claim 21 wherein said signaling step provides a signal based on the rate of change of count rate of arcs detected.

* * * * *